US012648469B2

(12) United States Patent
Yan et al.

(10) Patent No.: US 12,648,469 B2
(45) Date of Patent: Jun. 2, 2026

(54) FAN-OUT PACKAGE STRUCTURE WITH INTER-CHIP FINE INTERNAL INTERCONNECTION LINE AND MANUFACTURING METHOD THEREOF

(71) Applicant: Institute of Semiconductors, Guangdong Academy of Sciences, Guangzhou (CN)

(72) Inventors: Yingqiang Yan, Guangzhou (CN); Chuan Hu, Guangzhou (CN); Yunzhi Ling, Guangzhou (CN); Wei Zheng, Guangzhou (CN); Zhitao Chen, Guangzhou (CN)

(73) Assignee: Institute of Semiconductors, Guangdong Academy of Sciences, Guangzhou (CN)

( * ) Notice: Subject to any disclaimer, the term of this patent is extended or adjusted under 35 U.S.C. 154(b) by 0 days.

(21) Appl. No.: 18/576,902

(22) PCT Filed: Oct. 18, 2022

(86) PCT No.: PCT/CN2022/125896
§ 371 (c)(1),
(2) Date: Jan. 5, 2024

(87) PCT Pub. No.: WO2024/082130
PCT Pub. Date: Apr. 25, 2024

(65) Prior Publication Data
US 2025/0246533 A1     Jul. 31, 2025

(51) Int. Cl.
*H10W 70/65* (2026.01)
*H05K 1/181* (2026.01)
(Continued)

(52) U.S. Cl.
CPC ............ *H10W 70/65* (2026.01); *H05K 1/181* (2013.01); *H05K 3/303* (2013.01);
(Continued)

(58) Field of Classification Search
CPC . H10W 70/65; H10W 70/093; H10W 70/095; H10W 74/017; H10W 74/117;
(Continued)

(56) References Cited

U.S. PATENT DOCUMENTS

| | | | | |
|---|---|---|---|---|
| 7,061,087 | B2 * | 6/2006 | Kim ...................... | H10W 90/00 |
| | | | | 257/E25.023 |
| 11,289,424 | B2 * | 3/2022 | Wu .......................... | H10P 72/74 |

(Continued)

FOREIGN PATENT DOCUMENTS

| | | |
|---|---|---|
| CN | 107689359 | 2/2018 |
| CN | 110197793 | 9/2019 |

(Continued)

OTHER PUBLICATIONS

Written Opinion of the International Searching Authority, dated Oct. 18, 2022, 8 pages.
International Search Report, dated Oct. 18, 2022, 6 pages.
English Abstract of Cited Patent Documents, no date, 2 pages.

*Primary Examiner* — Tuyen K Vo
(74) *Attorney, Agent, or Firm* — Gunther J. Evanina; BUTZEL LONG

(57) ABSTRACT

Provided are a fan-out package structure and a manufacturing method thereof. The fan-out package structure provided in the embodiments of the present disclosure, and the fan-out package structure obtained by the manufacturing method provided in the embodiments of the present disclosure have an inter-chip fine interconnection line between functional surfaces of chips, so that fine interconnection pin pads of adjacent chips form electrical interconnection.

20 Claims, 8 Drawing Sheets

(51) Int. Cl.

| | |
|---|---|
| *H05K 3/303* | (2026.01) |
| *H10W 70/05* | (2026.01) |
| *H10W 74/01* | (2026.01) |
| *H10W 74/10* | (2026.01) |
| *H10W 90/00* | (2026.01) |

(52) U.S. Cl.
CPC ....... *H10W 70/093* (2026.01); *H10W 70/095* (2026.01); *H10W 74/017* (2026.01); *H10W 74/117* (2026.01); *H10W 90/00* (2026.01); *H10W 90/701* (2026.01); *H05K 2201/10522* (2013.01); *H10W 90/724* (2026.01); *H10W 90/794* (2026.01)

(58) Field of Classification Search
CPC . H10W 90/00; H10W 90/701; H10W 90/724; H10W 90/794; H10W 70/60; H10W 74/01; H10W 74/019; H05K 1/181; H05K 3/303; H05K 2201/10522
See application file for complete search history.

(56) References Cited

U.S. PATENT DOCUMENTS

| | | | | |
|---|---|---|---|---|
| 2001/0054761 A1* | 12/2001 | Han | .............. | H10W 90/811 257/723 |
| 2007/0048969 A1* | 3/2007 | Kwon | ............. | H10W 20/023 257/E21.705 |
| 2007/0114639 A1* | 5/2007 | Lin | ............. | H10W 72/20 257/E23.021 |
| 2019/0131269 A1* | 5/2019 | Lee | ............. | H10W 70/09 |
| 2020/0176384 A1* | 6/2020 | Wu | ............. | H10P 72/74 |
| 2020/0312772 A1* | 10/2020 | Xi | ............. | H10P 72/74 |
| 2021/0074645 A1* | 3/2021 | Tsai | ............. | H10W 70/611 |
| 2024/0113076 A1* | 4/2024 | Libsch | ............. | H10W 90/00 |

FOREIGN PATENT DOCUMENTS

| | | | | |
|---|---|---|---|---|
| CN | 111244082 | 6/2020 | | |
| CN | 114284240 | 4/2022 | | |
| EP | 1471574 A2 * | 10/2004 | .............. | B25F 1/02 |
| EP | 1471574 B1 * | 1/2008 | ............ | H05K 1/113 |

* cited by examiner

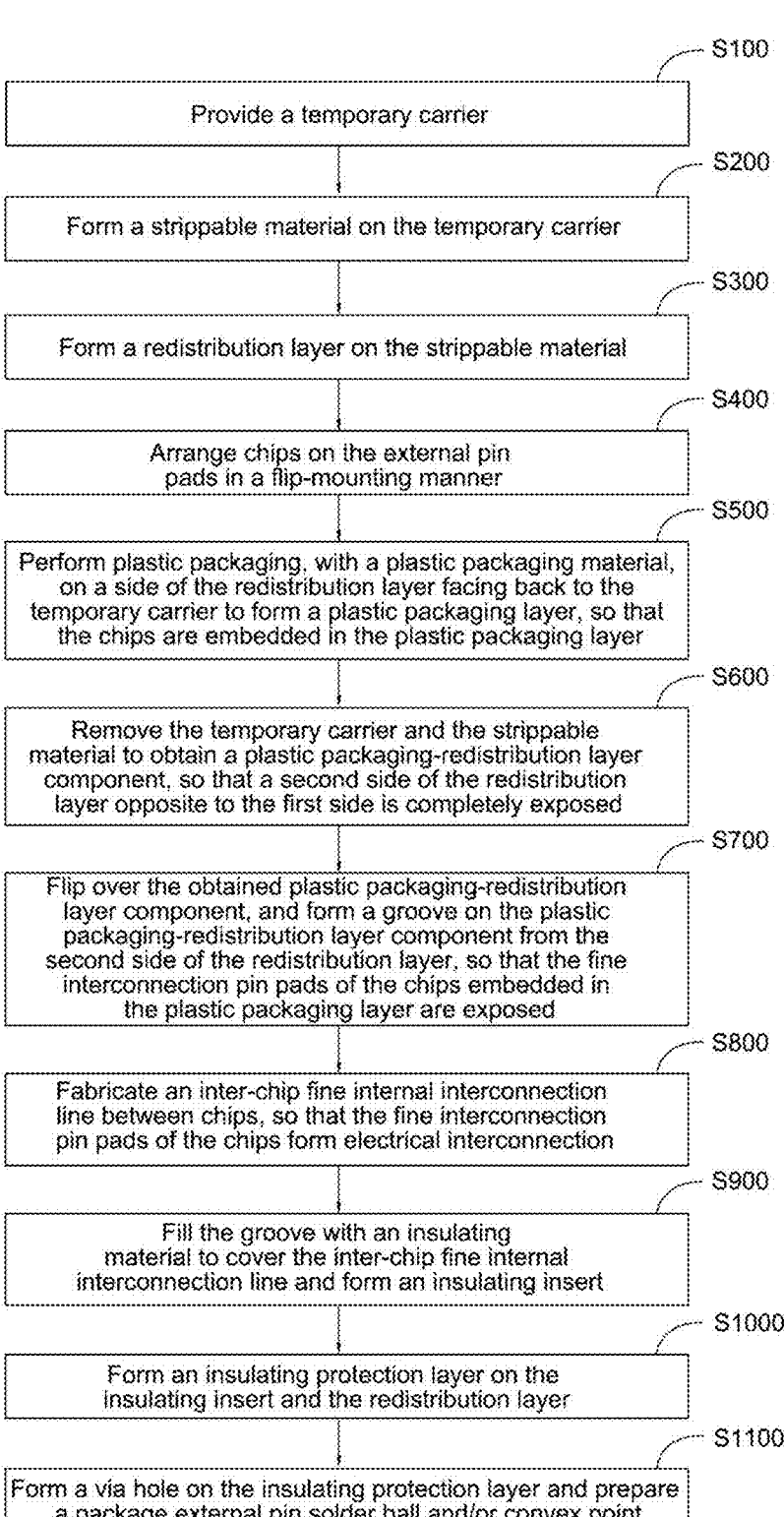

S100

Provide a temporary carrier

S200

Form a strippable material on the temporary carrier

S300

Form a redistribution layer on the strippable material

S400

Arrange chips on the external pin
pads in a flip-mounting manner

S500

Perform plastic packaging, with a plastic packaging material,
on a side of the redistribution layer facing back to the
temporary carrier to form a plastic packaging layer, so that
the chips are embedded in the plastic packaging layer

S600

Remove the temporary carrier and the strippable
material to obtain a plastic packaging-redistribution layer
component, so that a second side of the redistribution
layer opposite to the first side is completely exposed

S700

Flip over the obtained plastic packaging-redistribution
layer component, and form a groove on the plastic
packaging-redistribution layer component from the
second side of the redistribution layer, so that the fine
interconnection pin pads of the chips embedded in
the plastic packaging layer are exposed

S800

Fabricate an inter-chip fine internal interconnection
line between chips, so that the fine interconnection
pin pads of the chips form electrical interconnection

S900

Fill the groove with an insulating
material to cover the inter-chip fine internal
interconnection line and form an insulating insert

S1000

Form an insulating protection layer on the
insulating insert and the redistribution layer

S1100

Form a via hole on the insulating protection layer and prepare
a package external pin solder ball and/or convex point

FIG. 1

FAN-OUT PACKAGE STRUCTURE WITH INTER-CHIP FINE INTERNAL INTERCONNECTION LINE AND MANUFACTURING METHOD THEREOF

CROSS-REFERENCE TO RELATED APPLICATIONS

The present application is a U.S. National Phase Application of PCT International Application No. PCT/CN2022/125896, filed on Oct. 18, 2022, and entitled "Fan-Out Package Structure with Inter-Chip Fine Internal Interconnection Line and Manufacturing Method Thereof," the contents of which are incorporated herein by reference in its entirety.

TECHNICAL FIELD

The present disclosure relates to the technical field of chip heterogeneous integration and advanced packaging, and in particular, to a fan-out package structure with an inter-chip fine internal interconnection line and a manufacturing method thereof.

BACKGROUND ART

At present, preparation methods of an inter-chip fine interconnection line of fan-out package have high costs, silicon wafer (silicon bridge) embedding and mounting position accuracy can hardly be controlled, and particularly, it is difficult to control spacing position accuracy between two silicon bridges, thus causing difficulty in mounting and aligning a chip across a silicon bridge.

SUMMARY

The present disclosure provides a fan-out package structure with an inter-chip internal interconnection line and a manufacturing method thereof.

An embodiment of the present disclosure provides a manufacturing method of a fan-out package structure with an inter-chip fine internal interconnection line, including: providing a temporary carrier; forming a strippable material on the temporary carrier; forming a redistribution layer on the strippable material, wherein the redistribution layer includes an insulating material layer, interconnection lines embedded in the insulating material layer, and external pin pads, wherein the external pin pads are provided on a first side of the redistribution layer facing back to the temporary carrier and used for the interconnection lines; arranging chips on the external pin pads in a flip-mounting manner with a functional surface facing downwards, wherein each chip has a fine interconnection pin pad and a non-fine interconnection pin pad, wherein the fine interconnection pin pad is provided at an end portion of the functional surface of each chip close to an adjacent chip and is provided to face the redistribution layer, and the non-fine interconnection pin pad is provided on the functional surface of each chip and is electrically interconnected to the external pin pad of the interconnection line; performing plastic packaging, with a plastic packaging material, on a side of the redistribution layer facing back to the temporary carrier to form a plastic packaging layer, so that the chips are embedded in the plastic packaging layer; removing the temporary carrier and the strippable material to obtain a plastic packaging-redistribution layer component, so that a second side of the redistribution layer opposite to the first side is completely exposed; flipping over the obtained plastic packaging-redistribution layer component, and forming a groove on the plastic packaging-redistribution layer component from the second side of the redistribution layer, so that the fine interconnection pin pads of the chips embedded in the plastic packaging layer are exposed; fabricating an inter-chip fine internal interconnection line between the chips, so that the fine interconnection pin pads of the chips form electrical interconnection; filling the groove with an insulating material to cover the inter-chip fine internal interconnection line and form an insulating insert; forming an insulating protection layer on the insulating insert and the redistribution layer; and forming a via hole on the insulating protection layer and preparing a package external pin solder ball and/or convex point.

An embodiment of the present disclosure further provides a fan-out package structure with an inter-chip fine internal interconnection line, including chips, an inter-chip fine internal interconnection line, a redistribution layer, a plastic packaging layer, an insulating insert, an insulating protection layer, and a package external pin solder ball and/or convex point. Two or more chips are embedded in the plastic packaging layer, each chip has a fine interconnection pin pad and a non-fine interconnection pin pad provided on a functional surface, wherein the functional surface of each chip is provided to face a first side of the plastic packaging layer, the fine interconnection pin pad of each chip is provided at an end portion of the functional surface close to an adjacent chip, and the non-fine interconnection pin pad of each chip is guided to the first side of the plastic packaging layer and is directly electrically interconnected with the external pin pad of the redistribution layer; the redistribution layer is arranged adjacent to the first side of the plastic packaging layer, the redistribution layer includes an insulating material layer, interconnection lines embedded in the insulating material layer, and external pin pads, wherein the external pin pads are provided on a surface of the redistribution layer connected to the first side of the plastic packaging layer and, and are configured to form electrical interconnection with the non-fine interconnection pin pads of the chips; the insulating insert is embedded in the redistribution layer and extends through the redistribution layer, and the insulating insert is partially embedded in the plastic packaging layer, completely covers the inter-chip fine internal interconnection line, and partially covers the functional surfaces of the chips which realize electrical interconnection by the inter-chip fine internal interconnection line; the insulating protection layer is provided on a side of the redistribution layer facing back to the plastic packaging layer, and covers the insulating insert and the redistribution layer; and the package external pin solder ball and/or convex point is provided on a side of the insulating protection layer facing back to the redistribution layer and forms electrical interconnection with the redistribution layer, wherein the inter-chip fine internal interconnection line is arranged between the adjacent chips, and is embedded in a package body, and the inter-chip fine internal interconnection line makes the fine interconnection pin pads of the adjacent chips form the electrical interconnection.

BRIEF DESCRIPTION OF DRAWINGS

In order to more clearly illustrate embodiments of the present disclosure, drawings which need to be used in the embodiments will be introduced briefly below, and it should be understood that the drawings below merely show some embodiments of the present disclosure, therefore, they should not be considered as limitation to the scope, and a person ordinarily skilled in the art still could obtain other relevant drawings according to these drawings, without using any inventive efforts.

FIG. 1 is a schematic flowchart showing a method for manufacturing a fan-out package structure according to an exemplary embodiment of the present disclosure.

Figure 2A:
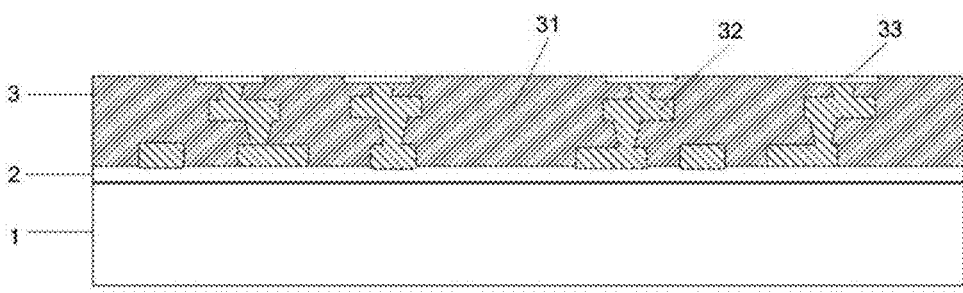

FIG. 2a is a schematic diagram showing the fan-out package structure according to an exemplary embodiment of the present disclosure during a manufacturing process.

Figure 2B:
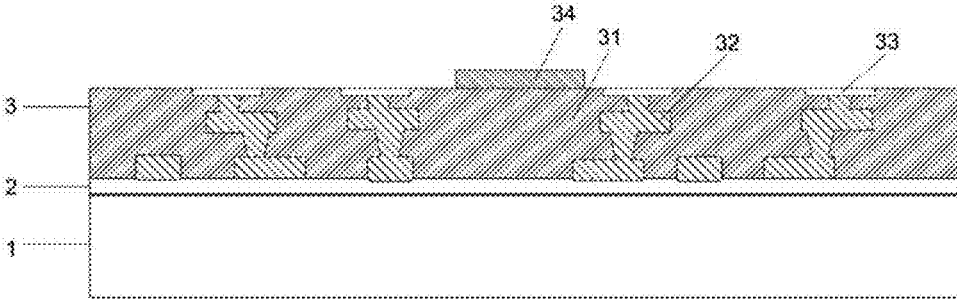

FIG. 2b is a schematic diagram showing the fan-out package structure according to an exemplary embodiment of the present disclosure during the manufacturing process.

Figure 3A:
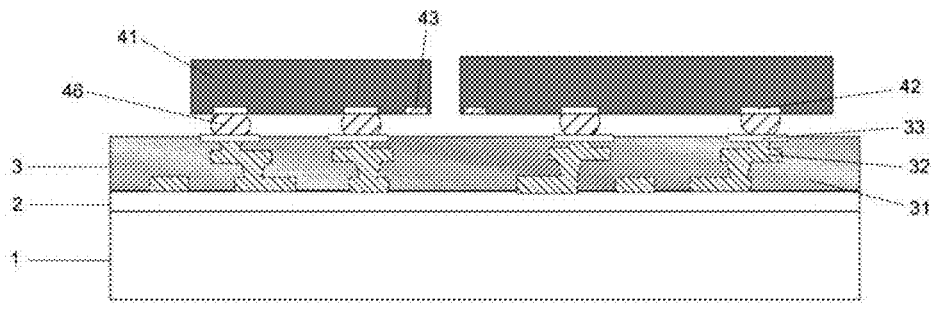

FIG. 3a is a schematic diagram showing the fan-out package structure according to an exemplary embodiment of the present disclosure during the manufacturing process.

Figure 3B:
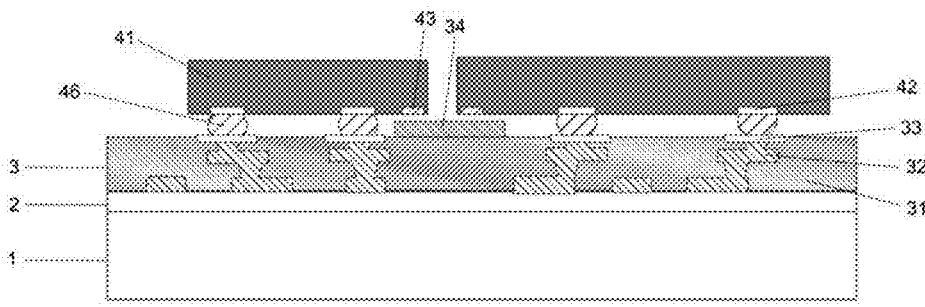

FIG. 3b is a schematic diagram showing the fan-out package structure according to an exemplary embodiment of the present disclosure during the manufacturing process.

Figure 4A:
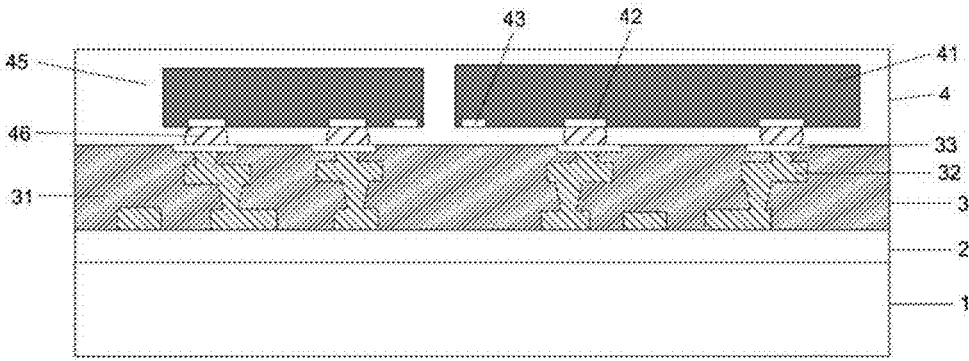

FIG. 4a is a schematic diagram showing the fan-out package structure according to an exemplary embodiment of the present disclosure during the manufacturing process.

Figure 4B:
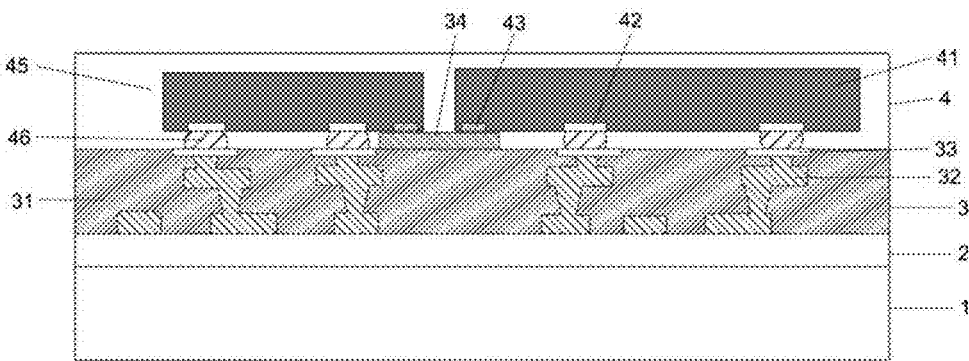

FIG. 4b is a schematic diagram showing the fan-out package structure according to an exemplary embodiment of the present disclosure during the manufacturing process.

Figure 5A:
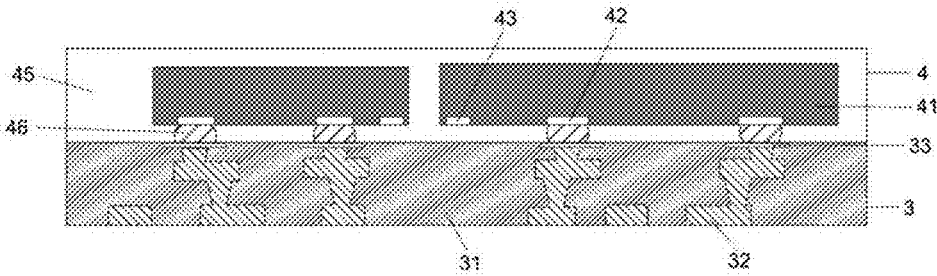

FIG. 5a is a schematic diagram showing the fan-out package structure according to an exemplary embodiment of the present disclosure during the manufacturing process.

Figure 5B:
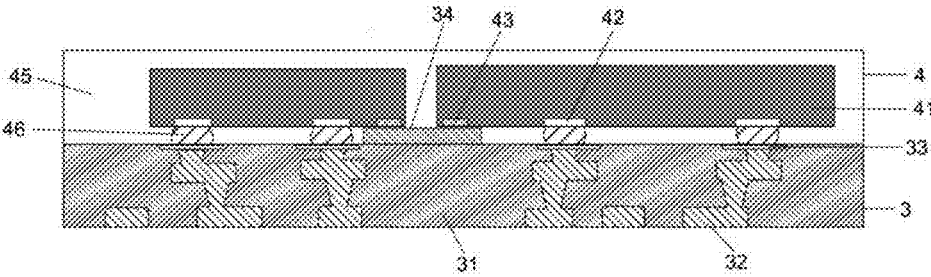

FIG. 5b is a schematic diagram showing the fan-out package structure according to an exemplary embodiment of the present disclosure during the manufacturing process.

Figure 6:
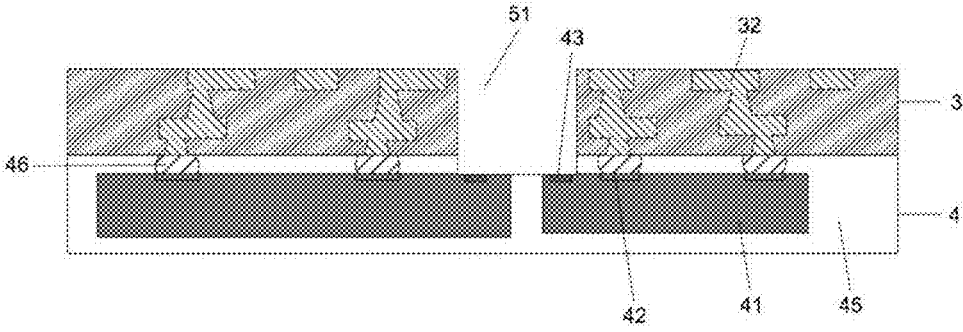

FIG. 6 is a schematic diagram showing the fan-out package structure according to an exemplary embodiment of the present disclosure during the manufacturing process.

Figure 7:
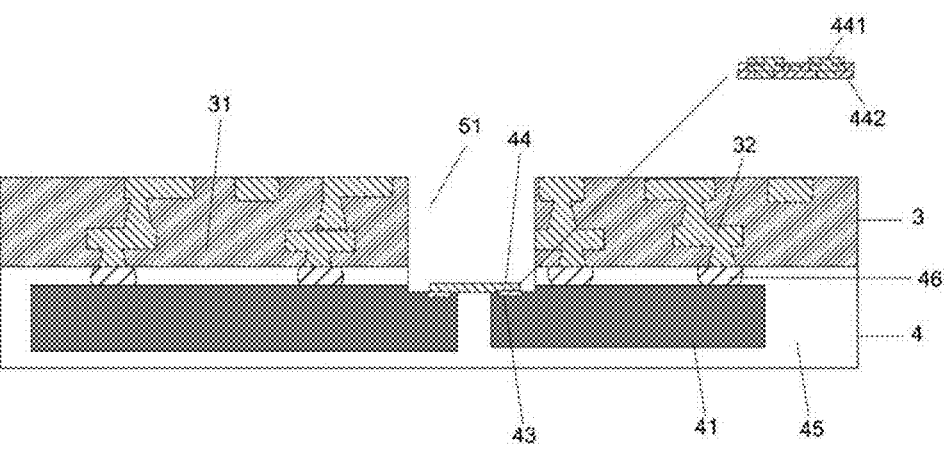

FIG. 7 is a schematic diagram showing the fan-out package structure according to an exemplary embodiment of the present disclosure during the manufacturing process.

Figure 8:
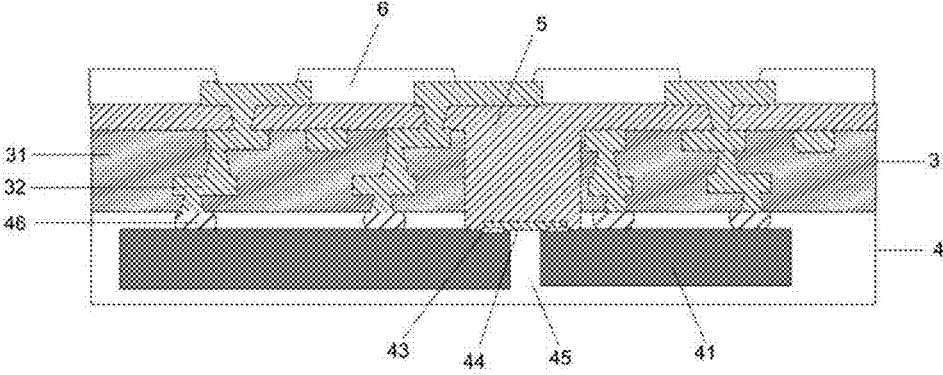

FIG. 8 is a schematic diagram showing the fan-out package structure according to an exemplary embodiment of the present disclosure during the manufacturing process.

Figure 9:
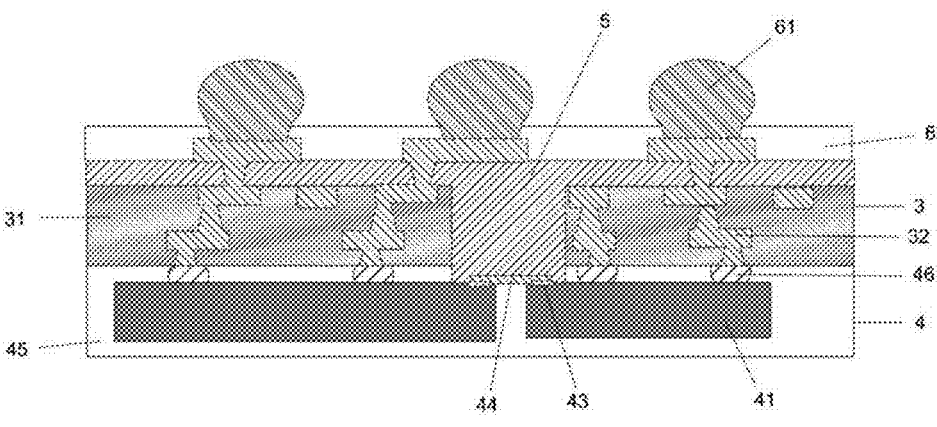

FIG. 9 is a schematic diagram showing the fan-out package structure according to an exemplary embodiment of the present disclosure during the manufacturing process.

Figure 10:
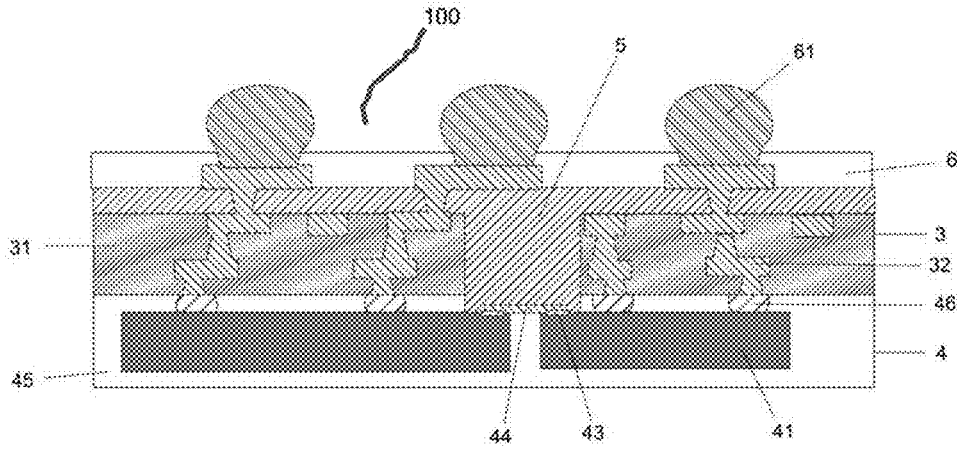

FIG. 10 is a schematic diagram showing the fan-out package structure with an inter-chip fine internal interconnection line according to an exemplary embodiment of the present disclosure.

Reference signs: 100—fan-out package structure; 1—temporary carrier; 2—strippable material; 3—redistribution layer; 31—insulating material layer; 32—interconnection line; 33—external pin pad; 34—victim block; 4—plastic packaging layer; 41—chip; 42—non-fine interconnection pin pad; 43—fine interconnection pin pad; 44—inter-chip fine internal interconnection line; 441—metal interconnection line; 442—insulating layer; 45—plastic packaging material; 46—chip flip bump; 5—insulating insert; 51—groove; 6—insulating protection layer; 61—package external pin solder ball and/or convex point.

DETAILED DESCRIPTION OF EMBODIMENTS

In order to make the objectives, examples, and advantages of the embodiments of the present disclosure clearer, the embodiments of the present disclosure will be described clearly and completely below in combination with the drawings of the embodiments of the present disclosure, apparently, the embodiments described are some but not all embodiments of the present disclosure. Generally, components in the embodiments of the present disclosure, as described and shown in the drawings herein, may be arranged and designed in various different configurations.

Currently, there are two preparation methods of an inter-chip fine interconnection line of fan-out package.

One preparation method is as follows: preparing a fine interconnection line (also collectively referred to as silicon bridge, wherein a line width/space of the fine interconnection line may be less than 5 μm, or even less than 2 μm) in advance on a material which is flat and not prone to deformation and has a small CTE coefficient, such as silicon, glass or ceramic, then cutting the fine interconnection line into individual silicon bridges, and finally embedding the silicon bridges into an IC carrier (printed circuit board). When a chip is flip-mounted, a fine interconnection pin pad of the chip is mounted on an interconnection pin pad of the silicon bridge, and a non-fine interconnection pin pad of the chip is electrically connected to other interconnection lines (a line width/space is greater than 5 μm, and even greater than 7 μm) in the IC carrier.

The other preparation method is as follows: preparing a fine interconnection line (also collectively referred to as silicon bridge, wherein the line width/space of the fine interconnection line may be less than 5 μm, or even less than 2 μm) in advance on a material which is flat and not prone to deformation and has a small CTE coefficient, such as silicon, glass or ceramic, then cutting the fine interconnection line into fine interconnection line individuals, embedded in a fan-out package plastic packaging material, or attached to a temporary bonding material like the chip, then flip-mounting the chip, wherein a fine interconnection pin of the chip is electrically connected to an interconnection pin of the silicon bridge, and a non-fine interconnection pin of the chip is electrically connected to other interconnection lines in the fan-out package.

A fan-out package structure provided in an embodiment of the present disclosure, and a fan-out package structure manufactured by a manufacturing method provided in an embodiment of the present disclosure, with use of adaptive exposure technology, can better ensure practicability of preparing the inter-chip fine internal interconnection line; omit the process flow of preparing the silicon bridge and the process flow of cutting and mounting the silicon bridge; and by performing high-accuracy mounting with use of self-aligning mounting technology, ensure position accuracy and consistency of adjacent chips, and avoid the defect of difficult mounting and aligning. Therefore, the fan-out package structure provided in the present disclosure and the package structure manufactured by the manufacturing method provided in the present disclosure can meet users' use requirements in more scenarios.

The following detailed description of the embodiments of the present disclosure provided in the drawings is not intended to limit the scope of the present disclosure claimed, but merely represents chosen embodiments of the present disclosure. All of other embodiments, obtained by those ordinarily skilled in the art based on the embodiments in the present disclosure without using any inventive efforts, shall fall within the scope of protection of the present disclosure.

In the following description with reference to the drawings, unless otherwise specified, the same reference signs in different drawings indicate the same or similar elements.

The terms used in the present disclosure are merely used for describing specific examples and are not intended to limit the present disclosure. Singular forms "one, "a (an)", and "this (the)" used in the present disclosure and the attached claims are also intended to include plural forms, unless other meanings are clearly indicated in the context. It also should be understood that the wordings "and/or" used in the present disclosure refer to any or all possible combinations including one or more relevant listed items.

In the description of the present disclosure, it should be indicated that orientation or positional relationships indicated by the terms such as "upper", "lower", "inner", and "outer", if appear, are orientation or positional relationships based on the drawings, or orientation or positional relationships in which the inventive product is conventionally placed in use, and are only intended to facilitate the description of the present disclosure and simplify the description, rather than indicating or implying that the referred devices or elements must be in a particular orientation or constructed or operated in the particular orientation, and therefore should not be construed as limitation to the present disclosure.

Besides, terms such as "first", "second", and "third", if appear, are merely used to distinguish the description, but should not be construed as indicating or implying relative importance.

It should be noted that the features in the embodiments of the present disclosure can be combined with each other without conflict.

Next, a manufacturing method for manufacturing a fan-out package structure and a fan-out package structure manufactured provided according to exemplary embodiments of the present disclosure will be described in detail with reference to the drawings.

FIG. 1 is a schematic flowchart showing a manufacturing method for manufacturing a fan-out package structure 100 according to an exemplary embodiment of the present disclosure. As shown in FIG. 1, in the present embodiment, the manufacturing method includes:

step S100, providing a temporary carrier;

step S200, forming a strippable material on the temporary carrier;

step S300, forming a redistribution layer on the strippable material, wherein the redistribution layer includes an insulating material layer, interconnection lines embedded in the insulating material layer, and external pin pads, wherein the external pin pads are provided on a first side of the redistribution layer facing back to the temporary carrier and used for the interconnection lines;

step 400, arranging chips on the external pin pads in a flip-mounting manner with a functional surface facing downwards, wherein each chip has a fine interconnection pin pad and a non-fine interconnection pin pad, wherein the fine interconnection pin pad is provided at an end portion of the functional surface of each chip close to an adjacent chip and is arranged to face the redistribution layer, and the non-fine interconnection pin pad is provided on the functional surface of each chip and is electrically interconnected to the external pin pad of the interconnection line;

step S500, performing plastic packaging, with a plastic packaging material, on a side of the redistribution layer facing back to the temporary carrier to form a plastic packaging layer, so that the chips are embedded in the plastic packaging layer;

step S600, removing the temporary carrier and the strippable material to obtain a plastic packaging-redistribution layer component, so that a second side of the redistribution layer opposite to the first side is completely exposed;

step S700, flipping over the obtained plastic packaging-redistribution layer component, and forming a groove on the plastic packaging-redistribution layer component from the second side of the redistribution layer, so that the fine interconnection pin pads of the chips embedded in the plastic packaging layer are exposed;

step S800, fabricating an inter-chip fine internal interconnection line between chips, so that the fine interconnection pin pads of the chips form electrical interconnection;

step S900, filling the groove with an insulating material to cover the inter-chip fine internal interconnection line and form an insulating insert;

step S1000, forming an insulating protection layer on the insulating insert and the redistribution layer; and step S1100, forming a via hole on the insulating protection layer and preparing a package external pin solder ball and/or convex point.

The fan-out package structure 100 with the inter-chip fine internal interconnection line can be manufactured by the manufacturing method provided in the embodiment of the present disclosure. The fan-out package structure manufactured by this method can realize internal interconnection between chips with different functions, realize accurate alignment of mounting, have simple process steps, save costs, and meet development requirements of high-density advanced packaging.

FIG. 2a to FIG. 9 are schematic diagrams showing the fan-out package structure according to exemplary embodiments of the present disclosure during a manufacturing process. The above steps S100~S1100 are introduced in detail below with reference to FIG. 2a to FIG. 9.

Referring to FIG. 2a and FIG. 2b, steps S100 to S300 are involved. A strippable material 2 can be formed first on a temporary carrier 1 provided. For example, the strippable material 2 can be coated on the temporary carrier 1. Then a redistribution layer 3 is formed on the strippable material 2. For example, the redistribution layer 3 is deposited on the strippable material 2. The redistribution layer 3 may include an insulating material layer 31, interconnection lines 32 embedded in the insulating material layer 31, and external pin pads 33 provided on a first side of the redistribution layer 3 facing back to the temporary carrier 1 and used for the interconnection line 32. The external pin pads 33 can be used to connect non-fine interconnection pin pads 42 of chips 41 with different functions, thereby facilitating flip-mounting of the chips 41 with different functions. In an optional embodiment, the external pin pads 33 can connect the non-fine interconnection pin pads 42 of the chips 41 with different functions via chip flip bumps 46. In an optional embodiment, the interconnection line 32 may be multilayer interconnection lines. The multilayer interconnection lines 32 are connected to each other by a conductive material in through holes. In an optional embodiment, the strippable material 2 is a layer of material in a temporary bonding material that is thermally, chemically, optically, or mechanically stripped.

In an optional embodiment, a redistribution layer (RDL) process can be used for the preparation of the interconnection line 32. The redistribution layer (RDL) process includes the following steps: providing a wafer; forming a Ti/Cu seed layer on the wafer using physical vapor deposition (PVD); depositing a photoresist on the Ti/Cu seed layer; making the photoresist patterned; then electroplating Cu to form a metal layer of Cu; removing the photoresist; and etching the Ti/Cu seed layer, so as to form an RDL metal line.

Referring to FIG. 2b, this embodiment differs from the embodiment of FIG. 2a because a victim block 34 can be arranged or prepared in an area of the first side of the redistribution layer where a groove 51 is to be formed. After the through hole penetrating the redistribution layer 3 is formed from the second side of the redistribution layer 3, the groove 51 can be formed by removing the victim block 34 via the through hole, so that the chip fine interconnection pin pad of the chip 41 is exposed. The victim block 34 is located between fine interconnection pin pad 43 of the chip 41 and the first side of the redistribution layer. A height of the victim block 34 can be just equal to or slightly less than the spacing between the fine interconnection pin pad 43 of the chip 41 and the first side of the redistribution layer. A width of the victim block 34 can be the same as a width of the groove 51, so that the fine interconnection pin pads 43 of adjacent chips 41 are all exposed after the victim block 34 is removed.

Referring to FIG. 3*a* and FIG. 3*b*, step S400 is involved. The chips 41 with different functions are flip-mounted, with the functional surfaces facing downwards, on the external pin pads 33 of the interconnection lines 32 in the redistribution layer 3. Each chip 41 may have the fine interconnection pin pad 43 and the non-fine interconnection pin pad 42. The fine interconnection pin pad 43 can be provided at an end portion of the functional surface of respective chip 41 close to an adjacent chip 41 and is provided to face the redistribution layer 3, and the non-fine interconnection pin pad 42 can be provided on the functional surface of respective chip 41 and is electrically interconnected with the external pin pad 33 of the interconnection line 32 through the chip flip bump 46. The chips 41 with different functions can be flip-mounted on the external pin pads 33 of the interconnection lines 32 in the redistribution layer 3 using a self-aligning mounting technology, a reflow soldering process, a hot-pressing bonding process or a hot-pressing ultrasonic bonding process. Such flip-mounting is realized by electrically interconnecting the non-fine interconnection pin pad 42 provided on the functional surface of each chip 41 and the external pin pad 33 of the interconnection line 32 by means of the chip flip-mounting bump 46. Through these processes, accurate alignment of the mounting is achieved, and a mounting speed is improved.

Referring to FIG. 4*a* and FIG. 4*b*, step S500 is involved. Plastic packaging is performed with a plastic packaging material 45 on a side of the redistribution layer 3 facing back to the temporary carrier 1 to form a plastic packaging layer 4, so that the chips 41 are embedded in the plastic packaging layer 4. The plastic packaging material 45 in the plastic packaging layer 4 can completely wrap the chips 41, and cover an upper surface of the redistribution layer 3. In an optional embodiment, before the plastic packaging is performed, under-filling is performed on a lower portion of the functional surface of each chip 41 and a gap between the non-fine interconnection pin pads 42, so that a gap between each chip 41 and the redistribution layer 3 is filled up with the plastic packaging material, thus there is no gap between the plastic packaging layer 4 and the redistribution layer 3.

In FIG. 4*b*, the plastic packaging material 45 in the plastic packaging layer 4 can cover the victim block 34 located on the upper surface of the redistribution layer 3.

Referring to FIG. 5*a* and FIG. 5*b*, step S600 is involved. The temporary carrier 1 and the strippable material 2 can be removed to obtain the plastic packaging-redistribution layer component, so that the second side of the redistribution layer 3 opposite to the first side is completely exposed. The plastic packaging-redistribution layer component includes the plastic packaging layer 4 and the redistribution layer 3. By separating the strippable material 2 from the redistribution layer 3, the temporary carrier 1 is separated from the redistribution layer 3. In an optional embodiment, the strippable material 2 is a layer of material in a temporary bonding material that is thermally, chemically, optically, or mechanically stripped.

Referring to FIG. 6, step S700 is involved. The obtained plastic packaging-redistribution layer component can be flipped over, and the groove 51 is formed on the plastic packaging-redistribution layer component from the second side of the redistribution layer 3. The groove 51 can extend from the second side of the redistribution layer 3 through at least a part of the redistribution layer 3 and the plastic packaging layer 4, such that the fine interconnection pin pads 43 of the chips 41 embedded in the plastic packaging layer 4 are exposed. The groove 51 can expose a part of the functional surface of each chip 41 and the fine interconnection pin pad 43 of each chip 41. The groove 51 can be formed through a process such as laser punching, thermal dissociation, solvent cleaning or dry etching.

In an optional embodiment, the plastic packaging-redistribution layer component obtained can be flipped over, then the through hole that extends through the redistribution layer 3 from the second side of the redistribution layer 3 is formed on the redistribution layer 3, and the victim block 34 is then removed through this through hole, so that the fine interconnection pin pads 43 of the chips 41 embedded in the plastic packaging layer 4 are exposed.

In an optional embodiment, in cases where there is the plastic packaging material 45 between the victim block 34 and the chips 41, the plastic packaging material 45 between the victim block 34 and the chips 41 can be removed through a process such as laser punching or solvent cleaning.

Referring to FIG. 7, step S800 is involved. An inter-chip fine internal interconnection line 44 between the chips 41 is fabricated, so that the fine interconnection pin pads 43 of the chips 41 form electrical interconnection. In the groove 51, the inter-chip fine internal interconnection line 44 is prepared between the functional surfaces of the chips 41 with different functions, so that the fine interconnection pin pads 43 of the chips 41 with different functions form electrical interconnection. The inter-chip fine internal interconnection line 44 may be of a single-layer line structure or a multilayer line structure. The inter-chip fine internal interconnection line 44 may include metal interconnection lines 441 and an insulating layer 442 between the metal interconnection lines 441. The inter-chip fine internal interconnection line 44 can directly cover the functional surface of each chip 41 and the plastic packaging material 45 between the chips 41. The inter-chip fine internal interconnection line 44 can be prepared through a semiconductor process such as adaptive exposure technology, PVD technology, electroplating technology, and 3D printing. In the adaptive exposure technology, an adaptive exposure device automatically adjusts an exposure pattern according to conditions such as expansion, deformation, and warping of a material, and offset and rotation of a chip.

In an optional embodiment, the fabrication of the inter-chip fine internal interconnection line 44 between the chips 41 includes: prefabricating a fine interconnection circuit board as the inter-chip fine internal interconnection line 44. The prefabricated fine interconnection circuit board is flip-mounted on the fine interconnection pin pads 43 of the chips 41 in a manner similar to that of the chips, so that the fine interconnection pin pads 43 of adjacent chips 41 form electrical interconnection. The prefabricated fine interconnection circuit board can be prepared on a material that is flat and not prone to deformation and has a small CTE coefficient, such as silicon, glass, and ceramic.

Referring to FIG. 8, step S900 is involved. The groove 51 is filled with an insulating material, so as to cover the inter-chip fine internal interconnection line 44 and form an insulating insert 5. A remaining space of the groove 51 (i.e., space other than the inter-chip fine internal interconnection line 44) can be filled with an insulating material, so as to cover the inter-chip fine internal interconnection line 44. That is, the insulating material can completely cover the inter-chip fine internal interconnection line 44. The insulating material can fill and level up the groove 51, so that an upper surface of the insulating insert 5 is flush with an upper surface of the redistribution layer 3. In an optional embodiment, the groove 51 can be filled with an insulating material so as to cover the inter-chip fine internal interconnection line 44, and a surface of a side of the redistribution layer 3 facing back to the plastic packaging layer 4 can be covered with the insulating material, so that a flange portion is formed at one end of the insulating insert 5 facing back to the plastic packaging layer 4. The flange portion can cover the redistribution layer 3. In an optional embodiment, one or more other redistribution layers can continue to be prepared on the flange portion of the insulating insert 5. Preparation method of other redistribution layers employs the foregoing RDL process.

Referring to FIG. 9, step S1000 and step S1100 are involved. The insulating protection layer is formed on the insulating insert 5 and the redistribution layer 3. A via hole is formed on the insulating protection layer 6 and a package external pin solder ball and/or convex point 61 are/is prepared. The package external pin solder ball 61 may be a BGA (ball grid array) package external pin solder ball, such as Sn—Ag—Cu alloy. In an optional embodiment, the package external pin solder ball 61 also can be replaced by a package type such as DFN (dual-flat no-leads) and QFN (quad-flat no-leads).

The fan-out package structure with the inter-chip fine internal interconnection line is described in detail below with reference to FIG. 10.

The fan-out package structure 100 includes the chip 41, the inter-chip fine internal interconnection line 44, the plastic packaging layer 4, the redistribution layer 3, the insulating insert 5, the insulating protection layer 6, and the package external pin solder ball and/or convex point 61.

Two or more chips 41 can be embedded in the plastic packaging layer 4. Each chip 41 may have the fine interconnection pin pad 43 and the non-fine interconnection pin pad 42 provided on the functional surface thereof. The functional surface of each chip 41 may be provided to face the first side of the plastic packaging layer 4, the fine interconnection pin pad 43 of each chip 41 can be provided at an end portion of the functional surface close to the adjacent chip 41, and form electrical interconnection with the fine interconnection pin pad 43 of the adjacent chip 41 through the inter-chip fine internal interconnection line 44, and the non-fine interconnection pin pad 42 of each chip 41 is guided to the first side of the plastic packaging layer 4 and is directly electrically interconnected with the external pin pad 33 of the redistribution layer 3. Two or more chips 41 can be flip-mounted on the external pin pad 33 of the interconnection line 32 in the redistribution layer 3 through a self-aligning mounting technology, a reflow soldering process, a hot-pressing bonding process or a hot-pressing ultrasonic bonding process. Such flip-mounting is realized by electrically interconnecting the non-fine interconnection pin pad 43 provided on the functional surface of each chip 41 and the external pin pad 33 of the interconnection line 32. The non-fine interconnection pin pad 42 can be electrically interconnected with the external pin pad 33 of the interconnection line 32 in the redistribution layer 3 through the chip flip-mounting bump 46. The inter-chip fine internal interconnection line 44 is arranged between adjacent chips 41, and is embedded in a package body, and the inter-chip fine internal interconnection line 44 makes the fine interconnection pin pads 43 of the adjacent chips 41 form the electrical interconnection. By means of such configuration, accurate alignment of the mounting is achieved, and a mounting speed is improved.

The redistribution layer 3 can be arranged on the plastic packaging layer 4 and adjacent to the first side of the plastic packaging layer 4. The redistribution layer 3 may include the insulating material layer 31, the interconnection line 32 embedded in the insulating material layer 31, and the external pin pad 33 that is provided on a surface of the redistribution layer 3 connected to the first side of the plastic packaging layer 4 and configured to form electrical interconnection with the non-fine interconnection pin pad 42 of the chip 41. The interconnection line 32 and the external pin pad 33 of the interconnection line 32 are provided in the insulating material layer 31 of the redistribution layer 3. The external pin pad 33 is electrically interconnected with the non-fine interconnection pin pad 42 of each chip 41. The external pin pad 33 can be electrically interconnected with the non-fine interconnection pin pad 42 through the chip flip bump 46. There is no gap between the plastic packaging layer 4 and the redistribution layer 3.

The insulating insert 5 can be embedded in the redistribution layer 3 and extend through the redistribution layer 3. The insulating insert 5 can be partially embedded in the plastic packaging layer 4, completely cover the inter-chip fine internal interconnection line 44, and partially cover the functional surfaces of the chips 41 which realize the electrical interconnection by the inter-chip fine internal interconnection line 44. In the groove 51, the inter-chip fine internal interconnection line 44 is provided between the functional surfaces of the chips 41 with different functions, so that the fine interconnection pin pads 43 of the chips 41 with different functions form the electrical interconnection. The inter-chip fine internal interconnection line 44 includes the metal interconnection lines 441 and the insulating layer 442 between the metal interconnection lines 441. The inter-chip fine internal interconnection line 44 is only electrically connected to the fine interconnection pin pads of adjacent chips 41. The inter-chip fine internal interconnection line 44 is of a single-layer line structure or a multilayer line structure. A line width/space of the inter-chip fine internal interconnection line 44 is smaller than that of the interconnection line 32 in the redistribution layer 3. The inter-chip fine internal interconnection line 44 directly covers the exposed functional surface of each chip 41 and the plastic packaging material 45 between the chips 41.

In an optional embodiment, the inter-chip fine internal interconnection line 44 may be a prefabricated fine interconnection circuit board. The prefabricated fine interconnection circuit board is flip-mounted on the fine interconnection pin pads 43 of the chips 41 in a manner similar to that of the chips, so that the fine interconnection pin pads 43 of adjacent chips 41 form electrical interconnection. The prefabricated fine interconnection circuit board can be prepared on a material that is flat and not prone to deformation and has a small CTE coefficient, such as silicon, glass, and ceramic.

The insulating insert 5 fills a remaining space of the groove 51 (i.e., space other than the inter-chip fine internal interconnection line 44), so as to cover the inter-chip fine internal interconnection line 44. That is, the insulating insert 5 completely covers the inter-chip fine internal interconnection line 44. The insulating insert 5 fills and levels up the groove 51, so that an upper surface of the insulating insert 5 is flush with an upper surface of the redistribution layer 3. In an optional embodiment, an end of the insulating insert 5 facing back to the plastic packaging layer 4 is configured to have a flange portion, which covers a surface of a side of the redistribution layer 3 facing back to the plastic packaging layer 4. In an optional embodiment, one or more other redistribution layers are provided on the flange portion of the insulating insert 5.

The insulating protection layer 6 can be provided on a side of the redistribution layer 3 facing back to the plastic packaging layer 4, and cover the insulating insert 5 and the redistribution layer 3. The package external pin solder ball and/or convex point 61 can be provided on a side of the insulating protection layer 6 facing back to the redistribution layer 3, and form electrical interconnection with the redistribution layer 3. The package external pin solder ball 61 may be a BGA package external pin solder ball, such as Sn—Ag—Cu alloy. In an optional embodiment, the package external pin solder ball 61 also can be replaced by other package types such as DFN and QFN.

Although not shown, it can be understood that the choice of metal material is not limiting in the present disclosure. For example, in some embodiments shown in the present disclosure, the metal material may include at least one of copper, aluminum, silver, or gold.

Although the present disclosure has been described with reference to exemplary embodiments, it should be understood that the present disclosure is not limited to specific embodiments described and shown in detail herein. Those skilled in the art could make various changes to the exemplary embodiments without departing from the scope defined by the claims of the present disclosure.

Features mentioned and/or shown in the description of exemplary embodiments of the present disclosure in the above may be incorporated into one or more other embodiments in the same or similar manner, be combined with the features in other embodiments, or replace corresponding features in other embodiments. These technical solutions obtained through combination or replacement should also be considered as being covered within the scope of protection of the present disclosure.

INDUSTRIAL APPLICABILITY

The above-mentioned are merely specific embodiments of the present disclosure, but the scope of protection of the present disclosure is not limited thereto, and variations or substitutions, that can be readily envisaged by any technician familiar with the present technical field within the technical scope disclosed in the present disclosure, shall be covered in the scope of protection of the present disclosure. Therefore, the scope of protection of the present disclosure should be determined by the scope of protection of the claims.

The above-mentioned are merely specific embodiments of the present disclosure, but the scope of protection of the present disclosure is not limited thereto, and variations or substitutions, that can be readily envisaged by any technician familiar with the present technical field within the technical scope disclosed in the present disclosure, shall be covered in the scope of protection of the present disclosure.

Therefore, the scope of protection of the present disclosure should be determined by the scope of protection of the claims.

What is claimed is:

1. A manufacturing method of a fan-out package structure with an inter-chip fine internal interconnection line, comprising steps of:

providing a temporary carrier;

forming a strippable material on the temporary carrier;

forming a redistribution layer on the strippable material, wherein the redistribution layer comprises an insulating material layer, interconnection lines embedded in the insulating material layer, and external pin pads, wherein the external pin pads are provided on a first side of the redistribution layer facing back to the temporary carrier and used for the interconnection lines;

arranging chips on the external pin pads in a flip-mounting manner with a functional surface facing downwards, wherein each chip has a fine interconnection pin pad and a non-fine interconnection pin pad, wherein the fine interconnection pin pad is provided at an end portion of the functional surface of each chip close to an adjacent chip and is provided to face the redistribution layer, and the non-fine interconnection pin pad is provided on the functional surface of each chip and is electrically interconnected to the external pin pad of the interconnection line;

performing plastic packaging, with a plastic packaging material, on a side of the redistribution layer facing back to the temporary carrier to form a plastic packaging layer, so that the chips are embedded in the plastic packaging layer;

removing the temporary carrier and the strippable material to obtain a plastic packaging-redistribution layer component, so that a second side of the redistribution layer opposite to the first side is completely exposed;

flipping over the obtained plastic packaging-redistribution layer component, and forming a groove on the plastic packaging-redistribution layer component from the second side of the redistribution layer, so that the fine interconnection pin pads of the chips embedded in the plastic packaging layer are exposed;

fabricating an inter-chip fine internal interconnection line between the chips, so that the fine interconnection pin pads of the chips form electrical interconnection;

filling the groove with an insulating material to cover the inter-chip fine internal interconnection line and form an insulating insert;

forming an insulating protection layer on the insulating insert and the redistribution layer; and forming a via hole on the insulating protection layer and preparing a package external pin solder ball and/or convex point.

2. The manufacturing method according to claim 1, wherein the step of forming a redistribution layer on the strippable material comprises: arranging or preparing a victim block in an area of the first side of the redistribution layer where the groove is to be formed; and the step of forming a groove on the plastic packaging-redistribution layer component from the second side of the redistribution layer comprises: forming a through hole penetrating the redistribution layer, and removing the victim block to form the groove, so that the fine interconnection pin pads of the chips embedded in the plastic packaging layer are exposed.

3. The manufacturing method according to claim 1, wherein the chips are arranged on the external pin pads in a flip-mounting manner using a self-aligning mounting technology, a reflow soldering process, a hot-pressing bonding process or a hot-pressing ultrasonic bonding process.

4. The manufacturing method according to claim 1, wherein before the plastic packaging is performed, underfilling a lower portion of the functional surface of each of the chips and a gap between the non-fine interconnection pin pads, so that there is no gap between the plastic packaging layer and the redistribution layer.

5. The manufacturing method according to claim 1, wherein the groove is formed through a process such as laser punching, thermal dissociation, solvent cleaning or dry etching.

6. The manufacturing method according to claim 1, wherein preparation of the inter-chip fine internal interconnection line is realized through a semiconductor process such as adaptive exposure technology, PVD technology, electroplating technology, 3D printing.

7. The manufacturing method according to claim 1, wherein the strippable material is a layer of material in a temporary bonding material that is thermally, chemically, optically, or mechanically stripped.

8. The manufacturing method according to claim 1, wherein the inter-chip fine internal interconnection line is of a single-layer line structure or a multilayer line structure, and the inter-chip fine internal interconnection line comprises metal interconnection lines and an insulating layer between the metal interconnection lines.

9. The manufacturing method according to claim 1, wherein the step of fabricating an inter-chip fine internal interconnection line between the chips comprises: prefabricating a fine interconnection circuit board as the inter-chip fine internal interconnection line, and flip-mounting, in a manner similar to the chips, the prefabricated fine interconnection circuit board on the fine interconnection pin pads of the chips, so that the fine interconnection pin pads of the adjacent chips form electrical interconnection.

10. The manufacturing method according to claim 9, wherein the prefabricated fine interconnection circuit board is prepared on a material that is flat and not prone to deformation and has a small CTE coefficient, such as silicon, glass, and ceramic.

11. The manufacturing method according to claim 1, wherein the insulating insert fills the groove, so that an upper surface of the insulating insert is flush with an upper surface of the redistribution layer.

12. The manufacturing method according to claim 1, wherein the step of filling the groove with an insulating material to cover the inter-chip fine internal interconnection line and form an insulating insert comprises: filling the groove with the insulating material so as to cover the inter-chip fine internal interconnection line, and covering a surface of a side of the redistribution layer facing back to the plastic packaging layer with the insulating material, so as to form a flange portion at an end of the insulating insert facing back to the plastic packaging layer.

13. The manufacturing method according to claim 12, wherein the non-fine interconnection pin pad is electrically interconnected with the external pin pad of the interconnection line of the redistribution layer through the chip flip-mounting bump.

14. A fan-out package structure with an inter-chip fine internal interconnection line, comprising chips, an inter-chip fine internal interconnection line, a redistribution layer, a plastic packaging layer, an insulating insert, an insulating protection layer, and a package external pin solder ball and/or convex point, wherein two or more chips are embedded in the plastic packaging layer, each chip has a fine interconnection pin pad and a non-fine interconnection pin pad provided on a functional surface, wherein the functional surface of each chip is provided to face a first side of the plastic packaging layer, the fine interconnection pin pad of each chip is provided at an end portion of the functional surface close to an adjacent chip, and the non-fine interconnection pin pad of each chip is guided to the first side of the plastic packaging layer and is directly electrically interconnected with the external pin pad of the redistribution layer;

the redistribution layer is arranged adjacent to the first side of the plastic packaging layer, the redistribution layer comprises an insulating material layer, interconnection lines embedded in the insulating material layer, and external pin pads, wherein the external pin pads are provided on a surface of the redistribution layer connected to the first side of the plastic packaging layer, and are configured to form electrical interconnection with the non-fine interconnection pin pads of the chips;

the insulating insert is embedded in the redistribution layer and extends through the redistribution layer, and the insulating insert is partially embedded in the plastic packaging layer, completely covers the inter-chip fine internal interconnection line, and partially covers the functional surfaces of the chips which realize electrical interconnection by the inter-chip fine internal interconnection line;

the insulating protection layer is provided on a side of the redistribution layer facing back to the plastic packaging layer, and covers the insulating insert and the redistribution layer; and the package external pin solder ball and/or convex point is provided on a side of the insulating protection layer facing back to the redistribution layer, and forms electrical interconnection with the redistribution layer, wherein the inter-chip fine internal interconnection line is arranged between the adjacent chips, and is embedded in a package body, and the inter-chip fine internal interconnection line makes the fine interconnection pin pads of the adjacent chips form electrical interconnection.

15. The fan-out package structure according to claim 14, wherein the two or more chips are arranged on the external pin pads in a flip-mounting manner through a self-aligning mounting technology, a reflow soldering process, a hot-pressing bonding process or a hot-pressing ultrasonic bonding process.

16. The fan-out package structure according to claim 14, wherein the inter-chip fine internal interconnection line is only electrically connected to the fine interconnection pin pads of adjacent chips.

17. The fan-out package structure according to claim 14, wherein the inter-chip fine internal interconnection line is of a single-layer line structure or a multilayer line structure, and the inter-chip fine internal interconnection line comprises metal interconnection lines and an insulating layer between the metal interconnection lines.

18. The fan-out package structure according to claim 14, wherein the inter-chip fine internal interconnection line is a prefabricated fine interconnection circuit board.

19. The fan-out package structure according to claim 18, wherein the prefabricated fine interconnection circuit board is prepared on a material that is flat and not prone to deformation and has a small CTE coefficient, such as silicon, glass, and ceramic.

20. The fan-out package structure according to claim 14, wherein line width/space of the inter-chip fine interconnection line is less than that of the interconnection lines in the redistribution layer.

\* \* \* \* \*